United States Patent
Guerreiro

(10) Patent No.: US 7,724,101 B2
(45) Date of Patent: May 25, 2010

(54) CRYSTAL OSCILLATOR CIRCUIT WITH AMPLITUDE CONTROL

(75) Inventor: Rodrigo M. Guerreiro, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 65 days.

(21) Appl. No.: 12/098,997

(22) Filed: Apr. 7, 2008

(65) Prior Publication Data

US 2008/0252390 A1  Oct. 16, 2008

(30) Foreign Application Priority Data

Apr. 5, 2007  (DE) ................ 10 2007 016 522

(51) Int. Cl.
  *H03B 5/36* (2006.01)
  *H03L 5/00* (2006.01)
(52) U.S. Cl. ............... 331/116 FE; 331/183; 331/109; 331/158; 331/74
(58) Field of Classification Search ............ 331/116 R, 331/116 FE, 158, 160, 109, 182, 183, 74; 330/253, 254, 255, 257, 258
See application file for complete search history.

(56) References Cited

U.S. PATENT DOCUMENTS

| | | | |
|---|---|---|---|
| 4,710,730 A * | 12/1987 | Doyle, III ............ | 331/116 FE |
| 5,351,012 A | 9/1994 | Toumazou | |
| 5,446,420 A | 8/1995 | Westwick | |
| 5,834,982 A * | 11/1998 | Watanabe et al. ........... | 331/109 |
| 6,278,336 B1 * | 8/2001 | Tinsley et al. ................ | 331/74 |
| 7,123,109 B2 * | 10/2006 | Stevenson et al. ........... | 331/109 |
| 7,355,489 B2 * | 4/2008 | Maheshwari ................ | 331/109 |
| 2006/0071729 A1 * | 4/2006 | Cetin et al. ................. | 331/158 |

FOREIGN PATENT DOCUMENTS

DE   3136300   9/1988

OTHER PUBLICATIONS

"High-Performance Crystal Oscillator Circuits: Theory and Application," IEEE Journal of Solid-State Circuits, vol. 23, No. 3, Jun. 1988 (Eric A. Vittoz, Senior Member, IEEE; Marc G.R. Degrauwe, Member, IEEE, and Serge Bitz), pp. 774-783.

* cited by examiner

*Primary Examiner*—Robert Pascal
*Assistant Examiner*—Ryan J Johnson
(74) *Attorney, Agent, or Firm*—John J. Patti; Wade J. Brady III; Frederick J. Telecky, Jr.

(57) ABSTRACT

A crystal oscillator circuit includes a capacitive load stage coupled to a crystal; an amplifier stage including an amplifying transistor coupled to the crystal and to the capacitive load stage for establishing an oscillation signal at the amplifier stage output and a bias generator stage coupled to the amplifying transistor; an amplitude control stage to control the amplitude of the oscillation signal; a pick-up stage coupled to the amplifier stage and to the crystal to generate an oscillator output signal. The bias generator stage is configured as a degenerated common source amplifier.

14 Claims, 4 Drawing Sheets

CRYSTAL OSCILLATOR CIRCUIT WITH AMPLITUDE CONTROL

This application claims priority from German Patent Application No. 10 2007 016 522.8, filed 5 Apr. 2007, the entirety of which is hereby incorporated herein by reference.

FIELD OF THE INVENTION

The invention relates to a crystal oscillator circuit; and, more specifically, to a crystal oscillator circuit based on the Pierce oscillator architecture.

BACKGROUND

Crystal oscillators, in particular Pierce oscillators, are widely used in the art to provide stable clock signals. There is a general need to design circuitry that is both suitable for all kinds of applications and highly efficient with respect to the specific requirements of each application. Specifically, electronic devices or electronic circuitry which provide a crystal oscillator should be made to support as many crystals as possible while still providing a constant frequency, high (in absolute value) negative impedance, low phase noise, low power consumption and low power dissipation on the crystal. For integrated solutions, the integrated components and circuitry should be immune to all kinds of noise sources. A large frequency pulling range is also desirable.

A detailed discussion and a prior art solution for a Pierce oscillator is given in Vittoz, et al., "High-Performance Crystal Oscillator Circuits: Theory and Application," IEEE Journal of Solid-State Circuits, Vol. 23, No. 3, June 1988, p. 774. The crystal oscillator circuit presented by Vittoz includes an amplifier stage, an amplitude control stage, an output voltage regulator and an output amplifier. The amplitude control is necessary in order to provide a suitable negative impedance, when looking from the crystal into the respective input pins of the crystal oscillator circuit. The negative impedance should be equal to the equivalent serial resistance (ESR) of the crystal. A negative impedance that is too large has the disadvantages of high power dissipation and fast degradation of the crystal. If the negative impedance is smaller than the ESR, the oscillation may die out or there may be no oscillation at all.

The mechanism disclosed by Vittoz to control the ratio between the negative impedance and the ESR is based on control of the bias current through a transistor used as an amplifying transistor for the crystal. The bias current is controlled by an amplitude control circuit (ACC). The ACC monitors the amplitude of the oscillation and generates a control voltage to reduce or increase the amplitude. The control voltage is used to modify the current through the amplifying transistor. Due to the specific control mechanism used by Vittoz, however, the conversion gain is very high. Accordingly, the noise generated by the ACC is amplified and fed into the crystal oscillation loop. This severely degrades the phase noise performance. Furthermore, the crystal oscillator circuit suggested by Vittoz has only limited immunity to substrate noise or cross-talking when implemented on an integrated circuit, in particular in a system on chip (SoC).

Finally, the crystal oscillator suggested by Vittoz has only a small pulling range and poor adaptability to multiple different crystals.

SUMMARY

It is an object of the invention to provide a very flexible crystal oscillator circuit which has a wide frequency pulling range, high immunity to noise, reduced power dissipation, and small crystal degradation.

Accordingly, a crystal oscillator circuit is provided which includes a capacitive load stage, an amplifier stage, a pick-up stage, and an amplifier control stage. The capacitive load stage is coupled to a crystal. The amplifier stage includes a bias generator stage and an amplifying transistor coupled to the crystal and to the capacitive load stage for establishing an oscillation. The pick-up stage is coupled to the amplifier stage and to the crystal to generate an oscillator output signal. The amplitude control stage controls the amplitude of the oscillation signal at the crystal.

The crystal oscillator circuit according to described embodiments of the invention is based on a Pierce oscillator architecture. The bias generator stage is configured as a degenerated common source amplifier. Using a bias generator stage configured as a degenerated common source amplifier reduces the conversion gain and a corresponding noise injection. By using a degenerated common source amplifier configuration, the amplitude control voltage to bias current conversion is performed by the degenerating element (e.g., resistor or plurality of resistors) rather than by the transistor's transconductance, thereby reducing the conversion gain.

In described embodiments, the bias generator stage includes a control transistor and at least one resistive element coupled to the source of the control transistor, together forming the degenerated common source amplifier. The control transistor, having the resistive element as the degenerating element, receives an amplitude control voltage as a control signal from the amplitude control stage to selectively adjust a bias current through the amplifying transistor. Accordingly, the rather fine adjustment of the bias current in response to the amplitude control signal is performed by controlling the gate voltage of the control transistor. Because the gain of the control transistor is low, noise injection via the amplitude control mechanism is reduced.

In accordance with one implementation of the invention, the degenerated common source amplifier in the bias generator may be degenerated by means of a plurality of resistors. The crystal oscillator circuit may also include corresponding means (e.g., switches) to selectively switch the resistors into the current path through the degenerated common source amplifier in response to a digital configuration signal, thereby determining the bias current through the amplifying transistor. Switching resistors into the current path, makes it possible to predefine different ranges in response to a digital configuration signal for different crystals or different applications.

The capacitive load stage coupled to the crystal may be selectively switched such that the capacitive load effective for the crystal oscillator can be changed in response to a digital configuration signal. A variable capacitive load allows the crystal oscillator circuit to adapt to various different crystals. The load capacity should be selected according to the specifications of the crystal being used. Thus, a wide variety of crystals corresponds to a wide variety of load capacities.

By using the circuitry according to the desscribed implementation, the capacity selection can be made merely by switching capacitors. The switches may be implemented by means of transistors, dimensioned so that the quality factor of the capacitors is not significantly degraded for the working frequency.

As the resistive elements (that is, for example, the resistors) coupled to the control transistor and the capacitive load are controlled by the same digital configuration signal, a link is established between the bias current (i.e., the transconductance of the amplifying transistor) and the load capacity. Controlling both the capacitive load and the transconductance of the amplifying transistor is particularly useful because the negative impedance depends mainly on the load capacitors and on the transconductance of the amplifying transistor. A large capacitive load needs a large transconductance; but if the transconductance is too high, the negative impedance decreases again. Generally, the transconductance should be selected within a certain range for a determined load capacitor range. Accordingly, it is useful to use the same, or at least related, digital configuration signals for switching the resistors in order to define a specific bias current for the amplifying transistor and for switching the capacitive load. The invention suggests establishing a link between the capacitive load selection signal and the selected current range. This provides optimum adaptability of the oscillator circuit. Within the specific range, the amplitude control stage controls the bias current through the amplifying transistor in order to achieve an optimum transconductance within the preselected range.

In another aspect of the invention, the pick-up stage may be adapted to receive and process differential signals. This allows the pick-up stage to be coupled differentially (symmetrically) to opposite sides of the crystal. This approach is particularly useful for integrated solutions, where the crystal oscillator circuit is subject to all kinds of interferences and noise. The noise may cause malfunction of the oscillator, including glitches and double pulses. This aspect of the invention is based on the recognition that the noise primarily shows a common mode behavior, and the input and output signals of the amplifier stage are subject to a phase difference of close to 180 degrees. Thus, a differential pick-up stage significantly rejects all common mode interferences. Furthermore, use of differential stage generally improves phase noise at high frequency and reduces power consumption with respect to the conventional AC coupled inverter stage approach.

According to another aspect of the invention, a resistor may be coupled to the output of the amplifier stage on one side of the crystal to achieve improved adaptability of the oscillation frequency (i.e., to increase the pulling range). The resistor together with the load capacitance creates a pole, shifting the phase and allowing the crystal to work in a range where it is easier to adapt (pull) the frequency.

According to still another aspect of the invention, the capacitive load stage may include at least one NMOS transistor to serve as a capacitive load. Conventional solutions suggest the use of MOS varactors as a variable capacity. However, NMOS transistors used as controlled capacitance have a higher maximum-to-minimum capacitance variation.

BRIEF DESCRIPTION OF THE DRAWINGS

Further advantages and features of the invention will become apparent from the following detailed description of example embodiments, considered with reference to accompanying drawings, wherein.

DETAILED DESCRIPTION OF EXAMPLE EMBODIMENTS

Figure 1:
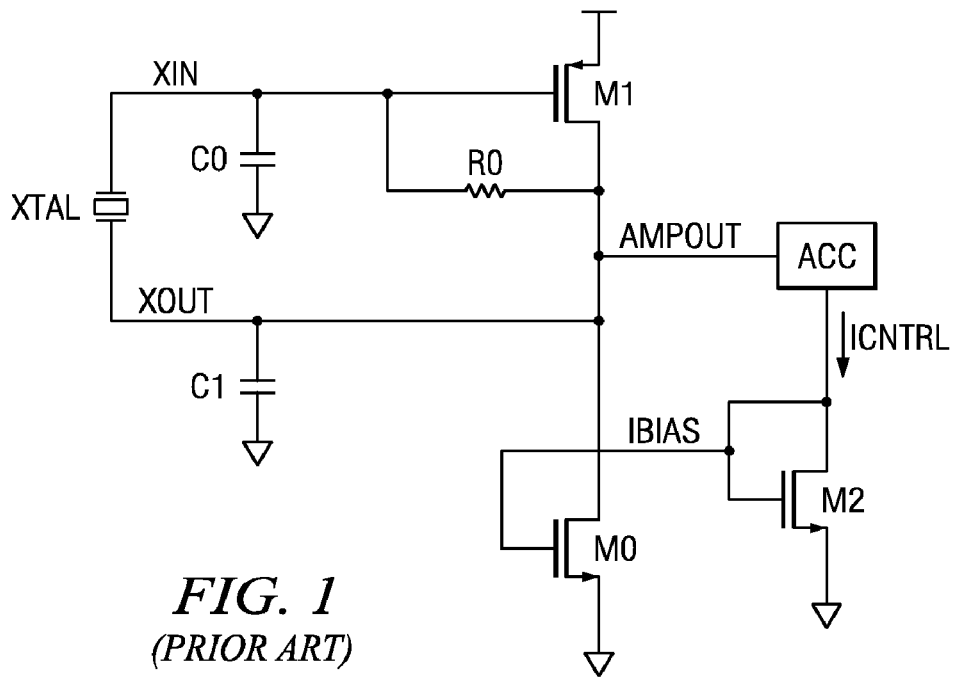
FIG. 1 (Prior Art) shows a simplified schematic of a Pierce crystal oscillator circuit according to the prior art.

FIG. 1 (Prior Art) shows a simplified schematic of a Pierce crystal oscillator circuit according to the prior art. As shown, a crystal XTAL is coupled to an amplifier stage including amplifying transistor M1. The output of the amplifier stage AMPOUT is coupled via resistor R0 to a terminal XIN of the crystal XTAL. The terminals XIN and XOUT of the crystal XTAL are coupled to respective capacitive loads C0 and C1. An amplitude control stage ACC is coupled to the output AMPOUT of the amplifier stage and serves to generate a control current ICNTRL, which is coupled by current mirror M2, M0 to the amplifier stage in order to adapt the transconductance of transistor M1 in response to the oscillation amplitude. Because the gain of the control loop comprising the current mirror and the amplitude control stage is typically very high, the amplitude control mechanism shown in FIG. 1 introduces additional and amplified noise into the Pierce crystal oscillator circuit.

Figure 2:
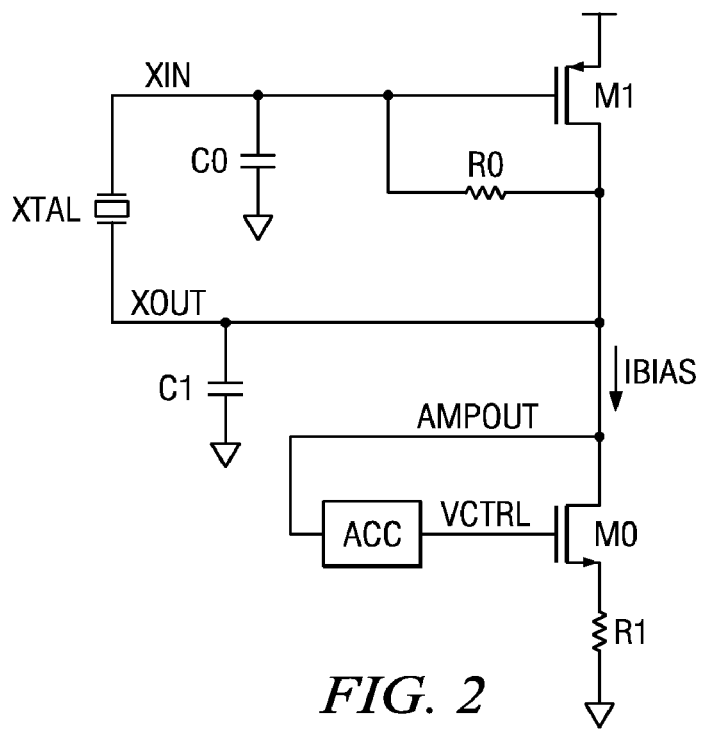
FIG. 2 shows a simplified schematic of a Pierce crystal oscillator circuit with an amplitude control according to an aspect of the invention.

FIG. 2 shows a simplified schematic of a Pierce crystal oscillator according to an embodiment of the invention. As shown, the amplitude control stage ACC is coupled to a bias generator stage which is now implemented as a degenerated common source amplifier by use of control transistor M0 and resistor R1. Accordingly, the gain of transistor M0 is reduced and the control voltage VCTRL used to adjust the transconductance of the amplifying transistor M1 is basically transformed into a bias current IBIAS by transistor R1. As a result, the noise introduced by the amplitude control stage ACC is substantially reduced.

Figure 3:
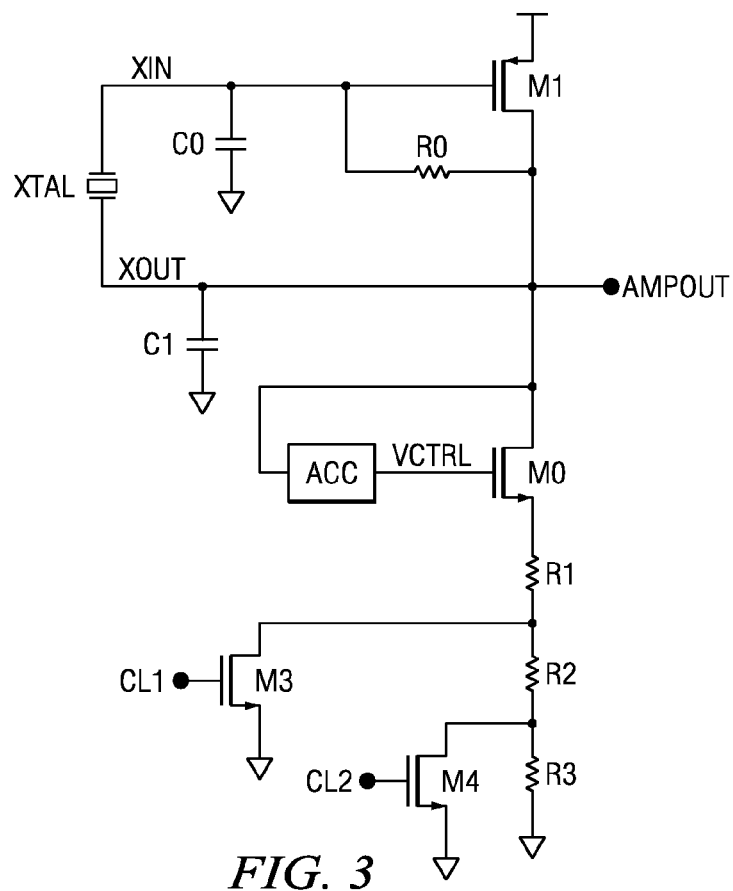
FIG. 3 shows a simplified schematic of a Pierce crystal oscillator circuit with an amplitude control according to another aspect of the invention.

FIG. 3 shows a simplified schematic of a Pierce crystal oscillator circuit according to another embodiment. As shown, a plurality of resistors R1, R2 and R3 are coupled in series to the source of NMOS transistor M0, which serves as a resistively degenerated control transistor, as explained with reference to FIG. 2 above. The resistors R1, R2 and R3 can be selectively bypassed by transistors M3 and M4 in response to a digital configuration signal, which is represented by CL1 and CL2. If necessary, more resistors, bypass transistors and more control signals may be provided to give additional configuration ranges. This approach allows the amplifier stage to be tuned roughly by switching resistors R1 to R3 into the current path through transistors M1 and M0. A more precise tuning of the amplitude is provided by the amplitude control stage ACC which controls the gate voltage of NMOS control transistor M0, that is selectively degenerated by the resistors R1 to R3.

Figure 4:
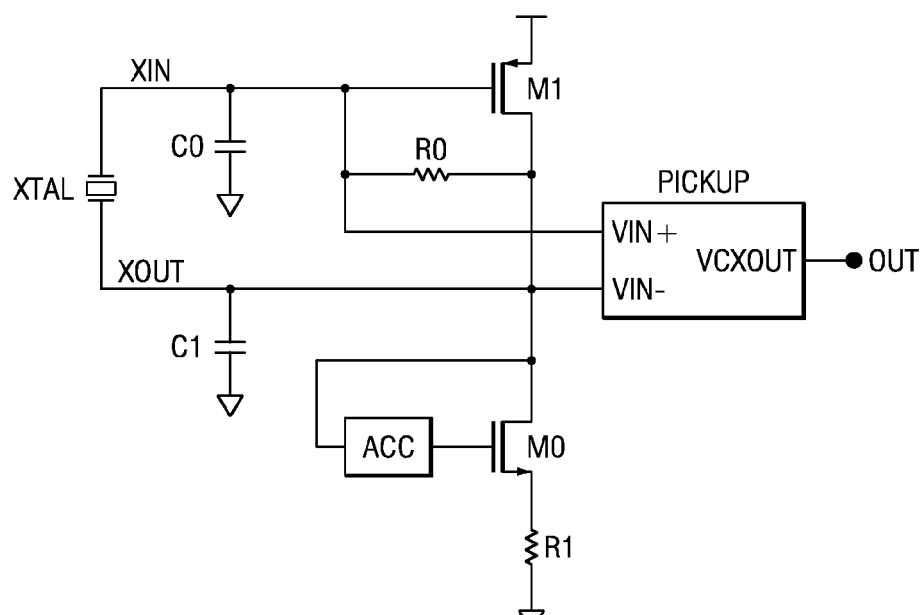
FIG. 4 shows a Pierce crystal oscillator circuit with a differential pick-up stage according to an aspect of the invention.

FIG. 4 shows a simplified schematic of a further embodiment of the invention. The circuitry of FIG. 4 is based on the circuitry of FIG. 2, except that a pick-up stage PICKUP is implemented as a differential stage coupled by input terminals VIN+ and VIN− respectively with both sides of the crystal XTAL, i.e., with crystal terminals XIN and XOUT. The pick-up stage PICKUP amplifies the differential input signal and transforms the signal into a single-ended output signal VCXOUT which serves as the oscillator output signal OUT. The differential pick-up stage allows common mode noise (substrate noise, crosstalk) to be suppressed.

Figure 5:
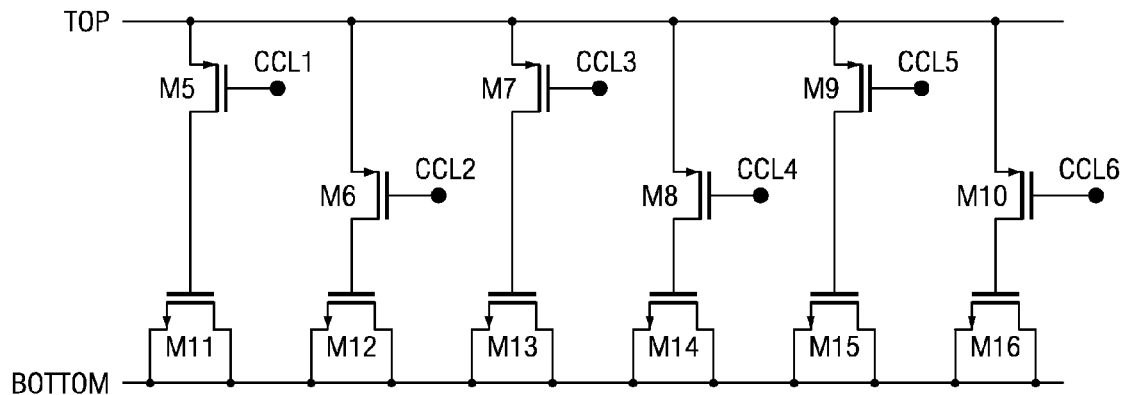
FIG. 5 shows a simplified schematic of a capacitive load stage comprising NMOS transistors according to an aspect of the invention.

FIG. 5 shows a simplified schematic of an example capacitive load stage according to an aspect of the invention. Either one, or both, of capacitors C0 and C1 may be implemented according to the circuitry shown in FIG. 5. A plurality of NMOS transistors M11, M12, M13, M14, M15 and M16 can be switched by respective PMOS transistors M5, M6, M7, M8, M9 and M10 to the TOP rail. The switching is done by a digital configuration signal represented by CCL1, CCL2, CCL3, CCL4, CCL5 and CCL6. This allows the capacitive load to be selectively switched in response to a digital control signal. The illustrated configuration may also be adopted to allow the resistors R1, R2, R3, . . . shown in FIG. 3 to be switched using the same digital configuration signal used for the capacitive load transistors shown in FIG. 5. By establishing a link between the switching of the resistors and the switching of the capacitive loads, it is possible to find an optimum operating range for the crystal oscillator by defining an optimum negative impedance. The indicated TOP rail may be coupled to the oscillator terminals XIN and XOUT and the indicated BOTTOM rail may be coupled to either receive the control voltage signal VCTRL or to a ground potential.

Figure 6:
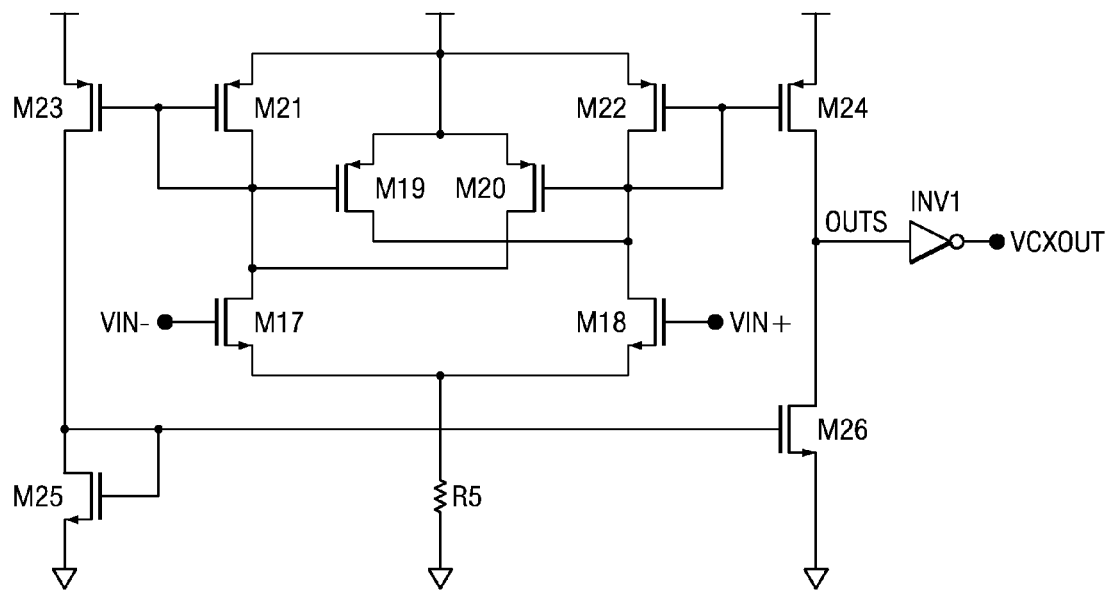
FIG. 6 shows a simplified schematic of a pick-up stage according to an embodiment of the invention.

FIG. 6 shows a simplified schematic of a differential pick-up stage according to another aspect of the invention. Transistors M17 and M18 receive the differential input signals VIN− and VIN+ (cf., FIG. 4) and serve as a differential pair. Transistors M21 and M22 represent the load to the differential pair M17 and M18, while transistors M23, M24, M25 and M26 constitute the output stage. Transistors M19 and M20 provide a feedback connection, such that the whole circuitry operates as a bistable circuit, producing an alternating clock signal at the single-ended output OUTS. The output OUTS is coupled to digital circuitry represented by an inverter INV1. Additional logical cells may be provided as appropriate.

Figure 7:
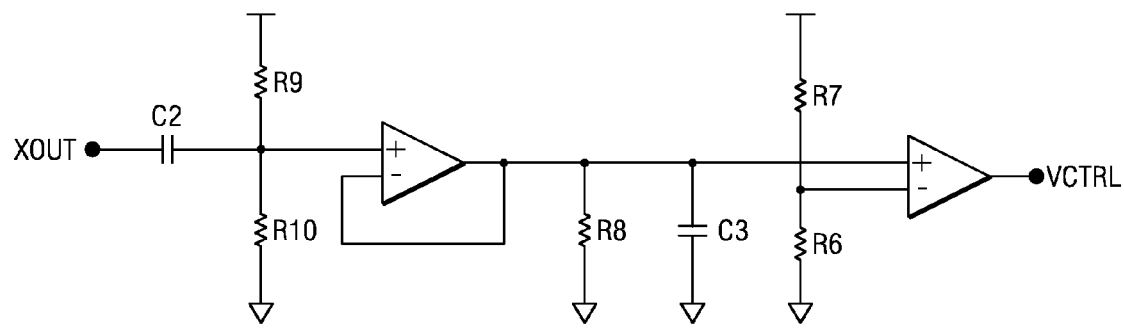
FIG. 7 shows a simplified schematic of an amplitude control stage according to an embodiment of the invention.

FIG. 7 shows a simplified schematic of an example amplitude control stage ACC according to the invention. In the ACC, the signal sampled from XOUT is detached from its original DC value by a capacitor C2 and attached to a DC value defined by resistors R9 and R10. It is then fed into a peak detector which will store its highest voltage (the peak voltage) value VPK. This peak voltage is then compared to the voltage defined by the resistive divider made up by resistors R6 and R7, resulting in the control voltage signal VCTRL. The difference between the voltages defined by the resistive divider R9, R10 and the resistive divider R6, R7 defines the amplitude to which the oscillation will be regulated. Resistor R8 serves as a pull-down resistor for capacitor C3.

Figure 8:
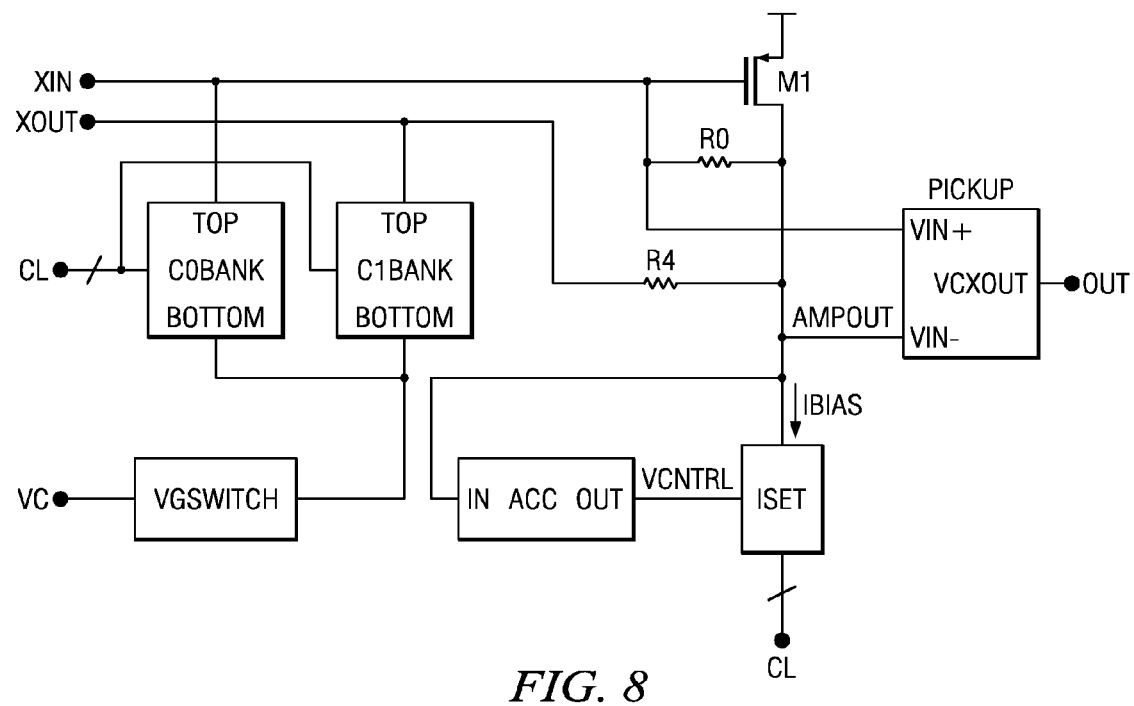
FIG. 8 is an overall block diagram view of a Pierce crystal oscillator circuit according to an embodiment of the invention.

FIG. 8 is a block diagram view of a Pierce crystal oscillator circuit implementation according to the invention. A crystal can be coupled to terminals XIN and XOUT as suggested in connection with FIG. 2. The amplifying transistor M1 and the resistor R0 provide the necessary amplification to establish an oscillation. The capacitors C0 and C1 (FIG. 2) are implemented as capacitor banks C0BANK and C1BANK, respectively, in a manner as shown in FIG. 5. The block ISET is the bias generator stage. It includes the switchable resistors (including the switches and additional logic gates to provide appropriate switching signals for the switches) that define the several selectable biasing points, as well as the transistor M0, thereby configuring the degenerated common-source amplifier.

The pick-up stage PICKUP is coupled to the XIN crystal terminal and to the amplifier output AMPOUT as shown in FIG. 4. However, in contrast to FIG. 4, a resistor R4 is coupled between the XOUT crystal terminal and the input VIN− of the pick-up stage PICKUP. The resistor R4 serves to enlarge the pulling range by shifting a pole of the transfer function, as explained above. The digital configuration signal CL is coupled to the capacitive load bank C0BANK and C1BANK and also to the bias current setting stage ISET. CL is used to provide digital control signals CL1, CL2 shown in FIG. 3 and CCL1 to CCL6 in FIG. 5. The number of switchable resistive and capacitance elements in the configurations of FIGS. 3 and 5 may advantageously be chosen so that their corresponding control signals have the same number of lines (or bits). Accordingly, the control mechanisms for setting the transconductance of transistor M1 and the setting of the capacitive loads are linked to each other in order to achieve optimum performance. If some of the resistors in block ISET are switched, some capacitors in C0BANK and C1BANK are likewise switched. The block VCSWITCH is used to switch the potential on nodes BOTTOM of C0BANK and C1BANK between ground and VC when working in VCXO mode.

What is claimed is:

1. A crystal oscillator circuit comprising:
    a capacitive load stage coupled to crystal terminals;
    an amplifier stage that establishes an oscillation signal at an amplifier stage output, wherein the amplifier stage includes:
        an amplifying transistor coupled to the crystal terminals and to the capacitive load stage;
        a control transistor coupled directly to the source of the amplifying transistor;
        a plurality of resistors coupled in series to the control transistor;
        switching circuitry that selectively switches one or more of the plurality of resistors into a current path through the control transistor in response to a digital configuration signal so as to determine the adjustable range of a bias current through the amplifying transistor;
    an amplitude control stage configured and coupled to control the amplitude of the oscillation signal by providing a signal to the control transistor; and
    a pick-up stage coupled to the amplifier stage and to the crystal terminals to generate an oscillator output signal.

2. The circuit of claim 1, wherein the control transistor is coupled to receive an amplitude control voltage from the amplitude control stage as a control signal to selectively adjust the bias current through the amplifying transistor.

3. The circuit of claim 1, wherein the pick-up stage is configured and coupled to receive differential signals and to be symmetrically coupled to the crystal terminals.

4. The circuit of claim 1, wherein the capacitive load stage is configured and coupled to selectively switch the capacitive load in response to the digital configuration signal.

5. The circuit of claim 1, comprising a resistor coupled between the amplifier stage output and one of the crystal terminals to achieve improved pullability of the oscillation frequency.

6. The circuit of claim 1, wherein the capacitive load stage comprises an NMOS transistor to serve as a capacitive load.

7. A crystal oscillator circuit comprising:
    a first crystal terminal;
    a second crystal terminal;

a capacitive load stage coupled to the first and second crystal terminals;

a first transistor having a first passive electrode, a second passive electrode, and a control electrode, wherein the control electrode of the first transistor is coupled to the capacitive load stage and the first crystal terminal, and wherein the second passive electrode of the first transistor is coupled to the capacitive load stage and the second crystal terminal;

a second transistor having a first passive electrode, a second passive electrode, and a control electrode, wherein the first passive electrode of the second transistor is coupled directly to the second passive electrode of the first transistor;

an amplitude control stage coupled to the second passive electrode of the first transistor and coupled to provide a signal to the control electrode of the second transistor;

a plurality of resistors coupled in series between the second passive electrode of the second transistor and ground;

switching circuitry that selectively switches one or more of the plurality of resistors into a current path through the second transistor in response to a digital configuration signal so as to determine the adjustable range of a bias current through the first transistor; and a pick-up stage coupled to the control electrode of the first transistor and the second passive electrode of the first transistor.

8. The circuit of claim 7, wherein the first transistor is a first PMOS transistor with the first passive electrode, the second passive electrode, and the control electrode being its source, drain, and gate, respectively.

9. The circuit of claim 8, wherein the second transistor is a first NMOS transistor the first passive electrode, the second passive electrode, and the control electrode being its drain, source, and gate, respectively.

10. The circuit of claim 9, wherein the pick-up stage further comprises:
a first current mirror;
a second current mirror;
a second PMOS transistor coupled to the first current mirror at its gate and the second current mirror at its drain;
a third PMOS transistor coupled to the second current mirror at its gate and the first current mirror at its drain;
a second NMOS transistor coupled to the first current mirror at its drain and the drain of the first PMOS transistor at its gate; and
a third NMOS transistor coupled to the second current mirror at its drain, the source of the second NMOS transistor at its source, and the gate of the first PMOS transistor at its gate.

11. The circuit of claim 7, wherein the capacitive load stage further comprises:
a first switchable capacitor bank coupled between the first crystal terminal and ground; and
a second switchable capacitor bank coupled between the second crystal terminal and ground.

12. The circuit of claim 11, wherein each of the first and second switchable capacitor banks further comprise a plurality of branches coupled in parallel with one another, wherein each branch includes:

a PMOS transistor coupled to one of the first and second crystal terminals at its source and that receives a control signal at its gate; and
an NMOS transistor coupled to ground at its drain and source and coupled to the drain of the PMOS transistor.

13. A crystal oscillator circuit comprising:
a first crystal terminal;
a first switchable capacitor bank coupled between the first crystal terminal and ground;
a second crystal terminal;
a second switchable capacitor bank coupled between the second crystal terminal and ground;
a first PMOS transistor coupled to the first crystal terminal and the first switchable capacitor bank at its gate and coupled to the second crystal terminal and the second switchable capacitor bank at its drain;
a first resistor coupled between the gate and drain of the first PMOS transistor;
a first NMOS transistor coupled to the drain of the first PMOS transistor at its drain;
an amplitude control stage coupled to the drain and gate of the first NMOS transistor;
a plurality of second resistors coupled in series between the source of the first NMOS transistor and ground;
switching circuitry that selectively switches one or more of the plurality of second resistors into a current path through the first NMOS transistor in response to a digital configuration signal so as to determine the adjustable range of a bias current through the first PMOS transistor; and
a pick-up stage including:
a first current mirror;
a second current mirror;
a second PMOS transistor coupled to the first current mirror at its gate and the second current mirror at its drain;
a third PMOS transistor coupled to the second current mirror at its gate and the first current mirror at its drain;
a second NMOS transistor coupled to the first current mirror at its drain and the drain of the first PMOS transistor at its gate; and
a third NMOS transistor coupled to the second current mirror at its drain, the source of the second NMOS transistor at its source, and the gate of the first PMOS transistor at its gate.

14. The circuit of claim 13, wherein each of the first and second switchable capacitor banks further comprise a plurality of branches coupled in parallel with one another, wherein each branch includes:
a fourth PMOS transistor coupled to one of the first and second crystal terminals at its source and that receives a control signal at its gate; and
an fourth NMOS transistor coupled to ground at its drain and source and coupled to the drain of the fourth PMOS transistor.

* * * * *